United States Patent [19]

Lange et al.

[11] Patent Number: 4,652,898
[45] Date of Patent: Mar. 24, 1987

[54] HIGH SPEED MERGED CHARGE MEMORY

[75] Inventors: Russell C. Lange, Wappingers Falls; Wen-Yuan Wang, Hopewell Junction, both of N.Y.

[73] Assignee: International Business Machines Corporation, Armonk, N.Y.

[21] Appl. No.: 632,562

[22] Filed: Jul. 19, 1984

[51] Int. Cl.4 .............................................. H01L 29/78
[52] U.S. Cl. ................................ 357/23.6; 357/23.11; 357/41; 357/53
[58] Field of Search ............... 357/23.6, 41, 53, 23.11; 365/149

[56] References Cited

U.S. PATENT DOCUMENTS

| 3,387,286 | 6/1968 | Dennard . | |
|---|---|---|---|
| 4,021,789 | 5/1977 | Furman et al. | 357/41 |
| 4,040,016 | 8/1977 | Lee et al. | 365/149 |
| 4,040,017 | 8/1977 | Lee . | |
| 4,080,590 | 3/1978 | Pricer . | |
| 4,141,027 | 2/1979 | Baldwin . | |
| 4,197,554 | 4/1980 | Meusburger . | |
| 4,334,236 | 6/1982 | Hoffmann . | |
| 4,366,613 | 1/1983 | Ogura . | |
| 4,392,210 | 7/1983 | Chan | 357/23.6 |
| 4,419,682 | 12/1983 | Masuoka | 357/23.6 |
| 4,419,743 | 12/1983 | Taguchi et al. | 357/23.6 |

OTHER PUBLICATIONS

Lee, "Analysis of the Merged Charge Memory (MCM) Cell," IBM J. Res. Develop., Sep. 1977, pp. 402–414.
Lange et al., "High Speed Merged Charge Memory," IBM Tech. Discl. Bull., vol. 26, No. 38, Aug. 1983, pp. 1525–1526.
Geipel et al., "Self-Aligned Fine Line Process for Making Capacitor Memories," IBM Tech. Discl. Bull., vol. 20, No. 7, 12/77, pp. 2588–2589.

Primary Examiner—Martin H. Edlow
Attorney, Agent, or Firm—Robert J. Haase

[57] ABSTRACT

A semiconductor memory produced in a unipolar technology includes a cell which has a diffusion storage capacitor with one overlying terminal being merged with a bit/sense line, the other capacitor terminal is a diffused region and is coupled through a word transfer device to a word line injector charge source held at a fixed voltage. To provide an organized array of these cells, each bit line cell includes a shared word line charge source held at a fixed voltage and formed at the surface of a semiconductor substrate. A diffusion storage capacitor also is formed at the surface of the semiconductor and spaced apart from the shared charge source. Information is written into each bit line capacitor by applying a voltage of either of two different magnitudes, representing 1 and 0 bits of information, to the respective bit line while a word selection pulse produces an inversion layer at the surface of the substrate between each bit line capacitor and its shared word line fixed voltage charge source. At the termination of the word pulse, the fixed voltage remains stored at the capacitor node. The capacitors having the larger voltage applied to the bit line terminal of the capacitors store the greater amount of charge. This charge can then be detected by measuring the voltage of the floating bit sense line when a word pulse again connects the fixed voltage charge source with each of its respective capacitors.

9 Claims, 10 Drawing Figures

HIGH SPEED MERGED CHARGE MEMORY

BACKGROUND OF THE INVENTION

1. Field of the Invention

This invention generally relates to integrated semiconductor processes and to memory circuits and, more particularly, to single device memory circuits employing a diffusion storage capacitor for binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. Conventional double polysilicon implementation of such cells required a shared contact for each cell. Consequently, the cell size tended to be large.

In also commonly assigned U.S. Pat. Nos. 4,080,590 by W. D. Pricer, and 4,040,017, by H. S. Lee, both filed Mar. 31, 1976, there are disclosed merged charge memories produced in a unipolar technology which is provided with very small cells, each of which includes substantially only a storage capacitor having a bit/sense line connected to one terminal of the capacitor and a word line which is selectively coupled to the other terminal of the capacitor. In the embodiments of these latter two patents, a direct current source of charges is produced at the surface of a semiconductor substrate and a plurality of inversion storage capacitors are formed also at the surface of the semiconductor substrate in a spaced apart relationship from the charge source. Voltage pulses representing binary digits are applied to one terminal of the capacitors and the other terminal of the capacitors is coupled to the direct current source of charges by the application of a word pulse to a word line. In order to preserve the information stored in the half-selected array cells while accommodating charge injection serially into the word-line accessed cells of both deep and shallow potential wells, only half of the charge capacity of the wells can be utilized as compared to the basic one device cell. Because the cells are accessed serially, its implementations forgo high speed read and write operations.

In an article entitled "A Capacitance-Coupled Bit-Line Cell for Mb Level DRAMS", by Masao Taguchi et al, in ISSCC Digest of Technical papers, Feb. 1984, pp. 100–101, a triple polysilicon capacitive-coupled bit line cell is used to achieve high storage capacitance. This structure requires a complex semiconductor process, and exhibits relatively poor topography and large cell area which are disadvantageous for high yield memory applications.

SUMMARY OF THE INVENTION

It is an object of this invention to provide an improved memory cell having a very small area which utilizes a single storage capacitor, a word transfer device and a shared fixed voltage charge source.

It is another object of this invention to provide a very high density memory array which is simple and inexpensive to fabricate.

It is still another object of this invention to provide an improved memory array wherein the size of each cell of the array is only six times the area of the intersection of a word line and a bit/sense line.

Yet a further object of this invention is to provide an improved organized memory array which is accessed by a simple switching arrangement employing a unipolar technology.

A further object of this invention is to provide an improved high density memory array having cells organized as a plurality of words with the cells including storage capacitors formed at the surface of a semiconductor substrate with field shield and P+ diffusion as isolation, and a shared fixed voltage charge source.

Still another object of this invention is to provide an improved memory array with cells providing strong signals.

It is another object of this invention to provide a method of fabricating such a high density memory device.

In accordance with the teaching of this invention, a memory cell is produced in a semiconductor substrate having a given conductivity type by providing a source of charges at the surface of the substrate and first and second conductive plates with a dielectric medium disposed between the substrate and the plates. A word line is selectively connected to the first plate which is deposited earlier in the process sequence, and a bit line which is deposited later in the process sequence to form the second plate. The first and second plates are arranged so that a continuous inversion layer is formed from the fixed shared charged source through a respective word line transfer device to each of the diffusion storage capacitors. Information is stored in the cell by storing predetermined amounts of charges, preferably electrons from the fixed voltage charge source, into diffusion storage surface potential produced by the voltage on the bit line.

In accordance with the teachings of a further aspect of this invention, an integrated circuit semiconductor memory array produced by a unipolar technology, is provided with very small cells, each of which includes substantially only a storage capacitor having a bit/sense line connected to one terminal of the capacitor and a word line controlling the coupling to the other terminal of the capacitor. In an embodiment of this invention, a shared source of charges is produced at the surface of a semiconductor substrate and a plurality of diffusion storage capacitors are formed also at the surface of the semiconductor substrate in a spaced apart relationship from the fixed voltage charge source.

Information is written into the capacitors by applying binary voltage pulses to one terminal of the capacitors while a word pulse produces inversion layers at the surface of the substrate to interconnect in a parallel arrangement the fixed voltage charge source with each of the capacitors. The binary voltage pulses have different magnitudes for representing a 0 and a 1 bit of information. The different voltage magnitudes produce different surface voltage levels in the diffusion storage node. The 0 bit has a higher surface voltage level than the 1 bit at the storage node in the store mode. When a word pulse establishes a connection between the capacitors and the fixed voltage charge source, the lower surface voltage level stores more charge. The increased charge then can be detected by determining the charge existing across the diffusion storage capacitors when a word pulse again connects the fixed charge source to each of the capacitors and the bit/sense lines are held a substantially equal potentials.

The foregoing and other objects, features and advantages of the invention will be apparent from the following more particular description of the preferred embodiment of the invention, as illustrated in the accompanying drawings.

DESCRIPTION OF THE PREFERRED EMBODIMENTS

Figure 1:
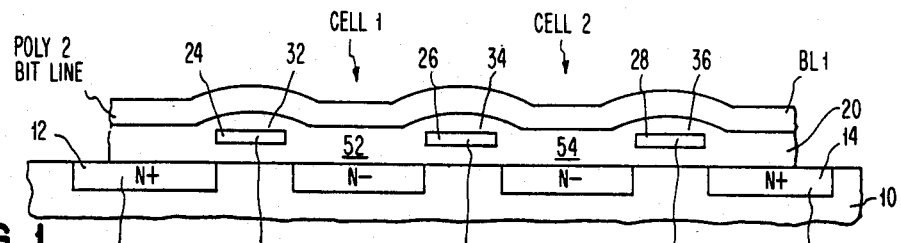
FIG. 1 is a sectional view of an embodiment of a semiconductor memory array of the present invention.

Referring to FIG. 1 in more detail, there is shown a section of the memory array of the invention which includes a semiconductor 10 having disposed therein diffusion regions 12, 14, 42 and 44. The substrate 10 may be of p type conductivity, typically boron doped, with the diffusion regions 12 and 14, of N+ type and the diffusion regions 42 and 44 of N-type, typically phosphorous or arsenic doped. Regions 12 and 14 are connected to a fixed voltage to provide a source of charges. Disposed on the surface of the semiconductor substrate 10 is an insulation layer 20 which is preferably made of silicon dioxide. The thickness of the silicon dioxide layer 20 may be, for example, 20 nm. A plurality of conductive lines 24, 26 and 28, preferably made of doped polycrystalline silicon, are disposed on layer N and are covered with insulating layers of oxidized polycrystalline silicon 32, 34 and 36, respectively. The conductive lines 24 and 28 are independent word lines WL1, WL2 respectively. Conductive line 26 is used as a shared isolation device for two different cells.

In the operation of the array illustrated in FIG. 1, a fixed voltage is applied to diffusion regions 12 and 14 to provide a source of charges, preferably electrons. When a voltage representing a binary digit is applied to bit/sense line BL1, the voltage produces a surface potential in the semiconductor interface. The surface potential of each of these storage regions depends upon the magnitude of the voltage associated with the information to be stored. The surface potential representing a 0 bit of binary information is higher than the surface potential associated with a 1 bit of binary information.

In order to store information in capacitors 52 and 54, it is necessary to introduce charges into the surface potential wells of these capacitors from the diffusion region 12 and 14. To introduce charges into the diffusion region 42 or 44, a word pulse having a positive polarity is applied to either word line WL1 or WL2. After diffusion region 42 is filled with the charges, the word pulse is terminatd and diffusion region 42 is left with a fixed voltage magnitude as storage capacitor 52 is now isolated from the charge source 12. Storage diffusion region 42 is also isolated from adjacent storage region 54 by the polysilicon field shield 26. The voltage on the bit line BL1 is pulsed back to the quiescent potential after the word line pulse has been terminated and the voltage of appropriate magnitude remains in the diffusion region to represent the stored binary digit.

Sense amplifiers (not shown) are connected to each one of the bit lines, as is well known in the art. During the read operation, the bit pulse voltage on all bit lines is floating. The word line pulse is set to a positive voltage with the sense signal indicating on the bit line a relatively large positive discharge for a "0" bit and a little or no discharge for a "1" bit.

Figure 2:
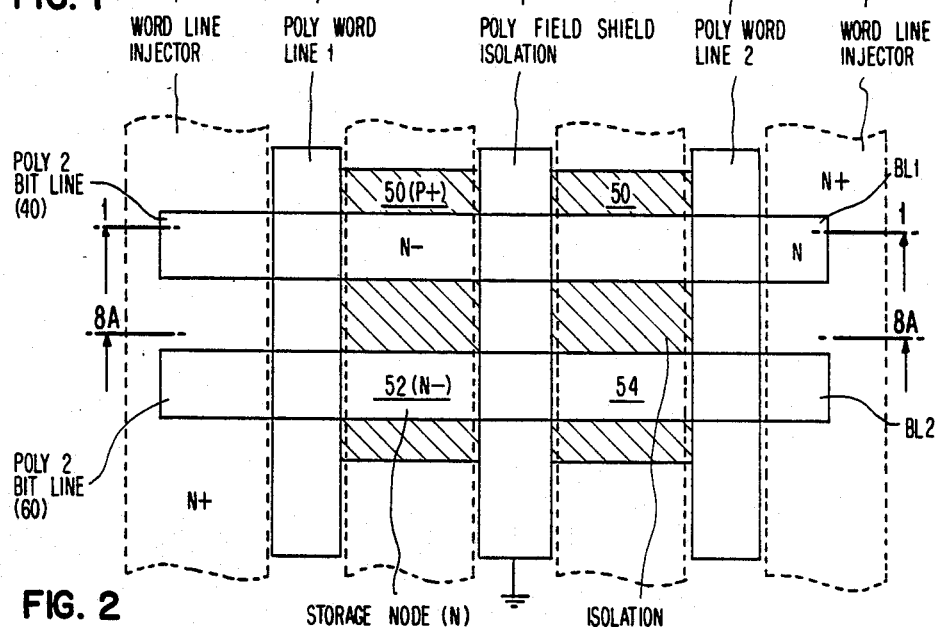
FIG. 2 is a plan view of memory array illustrated in FIG. 1 showing cells associated with two word lines and fixed voltage shared charge source.
Figure 3:
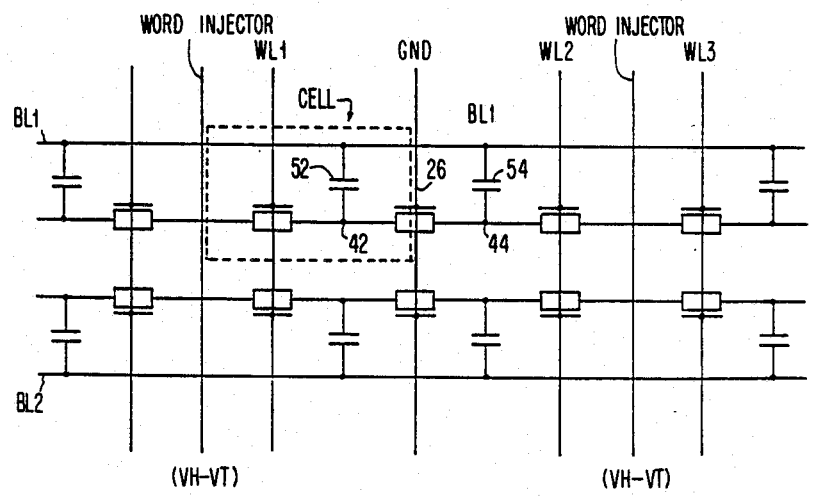
FIG. 3 is a simplified electrical schematic diagram of the memory array illustrated in FIG. 1.

There is shown in FIG. 3 a simplified electrical schematic diagram of the memory array illustrated in FIGS. 1 and 2 wherein common reference numerals refer to like elements. FIG. 2 is a plan view of a memory array showing two word lines WL1, WL2 and two bit lines BL1, BL2. Word lines WL1 and WL2 are the same word lines illustrated in section in FIG. 1. The bit line BL1 shown in FIG. 1 is indicated in FIG. 2 as being sectioned through 1-1. The bit line BL2 is similar to bit line BL1 and is a portion of another polysilicon line 60 which is similar to polysilicon line BL1 40.

Figure 4:
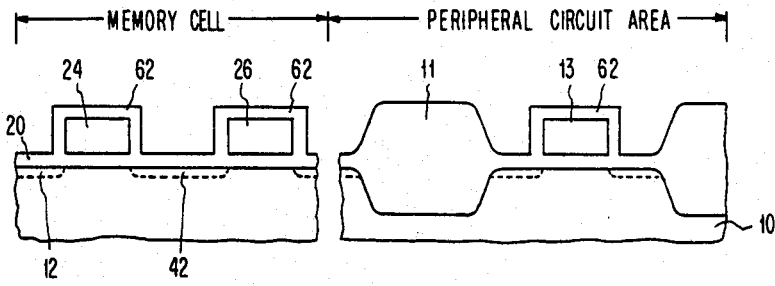
FIGS. 4 through 7 and 9 are schematic partial cross sectional views (along section 1-1 of FIG. 3) disclosing a high density memory device undergoing fabrication in accordance with the present invention.

In accordance with the invention, fabrication of the memory circuit begins, for example, with a p-type monocrystalline silicon body 10, shown in FIG. 4, which has had formed on its surface field oxide 11 of about 660 nm and gate oxide 20 of 20 nm and N-impurity type ion implanted regions outside the gate electrode region such as 12, 42, 44 and 14. Following ion implantation, annealing is effected so as to drive in the implanted ions and simultaneously, by reason of a low temperature (for example 800° C.), steam oxide, silicon dioxide layer 62 of thickness 200 nm is formed around the polysilicon gate electrodes 24, 26 and 28.

Figure 5:
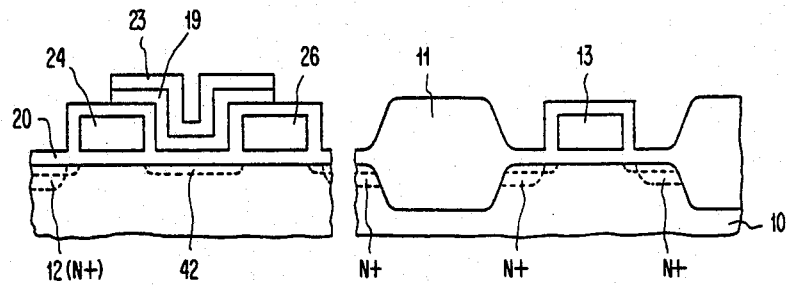

A blocking resist layer 23 (FIG. 5) and $Si_3N_4$ layer 19 are deposited over the storage nodes and delineated to form N+ doped regions 12 and 14.

Figure 6:
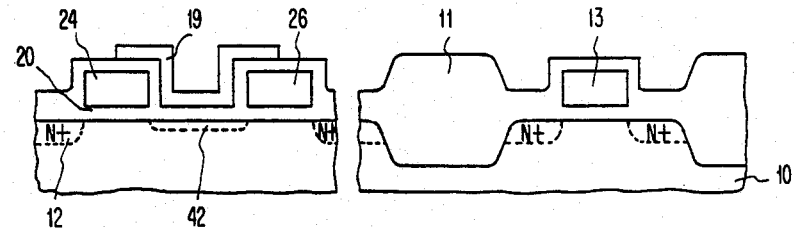

Next, the blocking photoresist layer 23 is removed and additional oxide of thickness 80 nm is grown outside the $Si_3N_4$ region using low temperature steam oxide. At this stage, the structure is as shown in FIG. 6.

Figure 7:
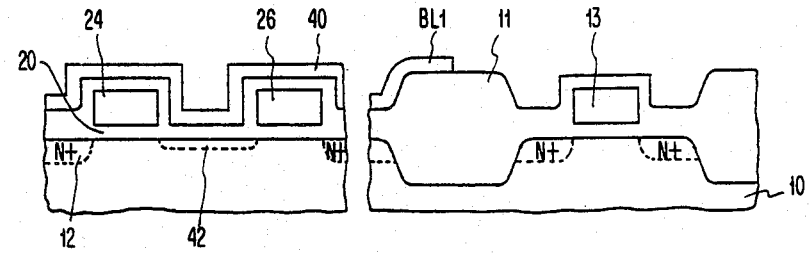

Then, a second layer of polysilicon 40 is deposited and delineated to form the bit line BL1 as shown in FIG. 7.

Figure 8A:
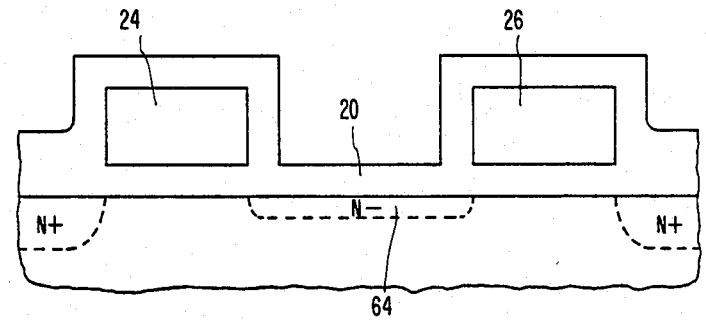
FIGS. 8A and 8B are cross sectional views (along section 8A—8A of FIG. 3), of the isolation regions of the memory device structure.
Figure 8B:
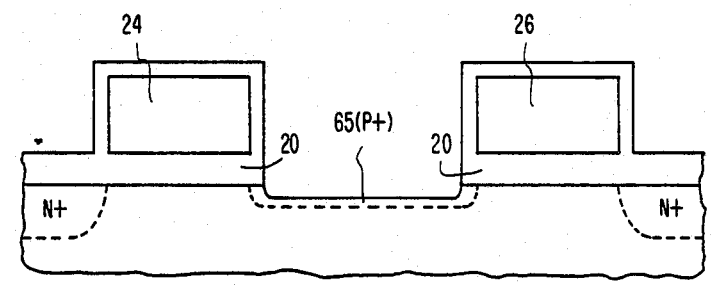

At this point, directional reactive ion etching (RIE) is used to remove the exposed thin oxide above N— implant 64 in isolation regions 50 as shown in FIG. 3 and in the cross sectional view of FIG. 8A. Next a high concentration boron ion implantation 65 is performed. The resulting structure in the isolation region is shown in FIG. 8B.

Figure 9:
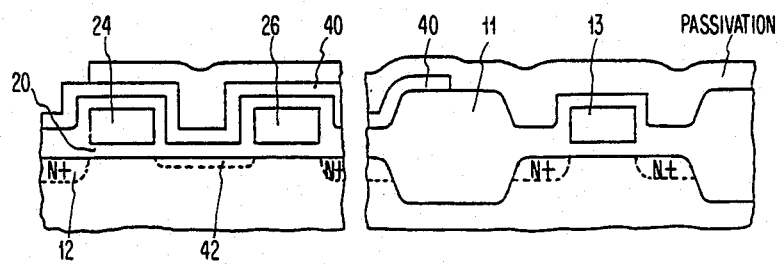

Completion of the memory device then can follow conventional procedures, i.e. reoxidation, deposition of silicon dioxide for device passivation, and metallization. Following these steps, the device takes on the form shown in FIG. 9.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of this invention.

We claim:

1. A capacitor memory array comprising, a semiconductor substrate of given conductivity type, a dielectric medium disposed on said substrate, conductive bit line means disposed in said dielectric medium partially defining a plurality of storage nodes at given regions on the surface of said substrate, means for applying data signals to said conductive means, each said node being further defined by a region in said substrate of conductivity type opposite to that of said substrate, whereby said node is coextensive with said region, with each said storage node consisting of a respective portion of said bit line means and of said dielectric medium and a respective said region of conductivity type opposite to that of said substrate, a plurality of word line sources of reference potential disposed in said surface of said substrate and spaced apart from respective ones of said nodes, each said source providing injected charge in parallel to said respective nodes, and word line means for selectively coupling each said source of reference potential to said respective nodes.

2. The array defined in claim 1 wherein said storage nodes are isolated from each other in the word line direction by localized areas of the same conductivity type as that of said substrate.

3. The array defined in claim 1 wherein said storage nodes are isolated from each other in the bit line direction by field shield means running in the word line direction.

4. The array defined in claim 1 wherein said word line sources of reference potential are regions of conductivity type opposite to the conductivity type of said substrate.

5. The array defined in claim 1 wherein each said conductive bit line means is a polysilicon line.

6. The array defined in claim 1 wherein said means for selectively coupling comprises a polysilicon line running in the word line direction between a respective source of fixed reference potential and storage nodes.

7. The array defined in claim 1 wherein said word line sources of fixed reference potential and said storage nodes comprise regions of conductivity type opposite to that of said substrate, said sources having higher impurity concentration than said nodes.

8. The array defined in claim 1 wherein said substrate is of P conductivity type.

9. The array defined in claim 1 wherein said dielectric medium is silicon dioxide.

* * * * *